United States Patent
Ha et al.

(10) Patent No.: US 11,139,195 B2
(45) Date of Patent: Oct. 5, 2021

(54) LIFT PIN UNIT AND SUBSTRATE SUPPORTING UNIT HAVING THE SAME

(71) Applicant: SEMES CO., LTD., Chungcheongnam-do (KR)

(72) Inventors: Kang Rae Ha, Chungcheongnam-do (KR); Hyung Joon Kim, Busan (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 152 days.

(21) Appl. No.: 16/043,537

(22) Filed: Jul. 24, 2018

(65) Prior Publication Data
US 2019/0035671 A1   Jan. 31, 2019

(30) Foreign Application Priority Data
Jul. 25, 2017   (KR) .................. 10-2017-0093924

(51) Int. Cl.
*H01L 21/687* (2006.01)
*H01L 21/67* (2006.01)

(52) U.S. Cl.
CPC .. *H01L 21/68742* (2013.01); *H01L 21/68735* (2013.01); *H01L 21/68757* (2013.01); *H01L 21/67103* (2013.01); *H01L 21/67109* (2013.01)

(58) Field of Classification Search
CPC ......... H01L 21/68742; H01L 21/68785; H01L 21/68757; H01L 21/68735; H01L 21/68764; H01L 21/67103; H01L 21/67109

See application file for complete search history.

(56) References Cited

U.S. PATENT DOCUMENTS

| | | | | |
|---|---|---|---|---|
| 5,796,066 A * | 8/1998 | Guyot | ................. | B23K 37/047 219/121.48 |
| 7,638,003 B2 * | 12/2009 | Satoh | ................. | C23C 16/4586 118/728 |
| 7,667,944 B2 * | 2/2010 | Naim | ............... | H01L 21/67109 361/234 |

(Continued)

FOREIGN PATENT DOCUMENTS

EP       2813716 A1    12/2014
JP   2001-274225 A    10/2001
(Continued)

OTHER PUBLICATIONS

JP-2001274225-A EspaceNet Translation (Year: 2001).*
(Continued)

*Primary Examiner* — Tyrone V Hall, Jr.
*Assistant Examiner* — Makena S Markman
(74) *Attorney, Agent, or Firm* — Li & Cai Intellectual Property (USA) Office

(57) ABSTRACT

Provided is a substrate supporting unit. The substrate supporting unit includes a susceptor supporting the substrate and having a pin hole vertically formed therein, a lift pin provided to move up and down along the pin hole, a support plate supporting the lift pin, and a driving unit vertically moving the support plate. The lift pin has a first magnetic substance formed at a lower end thereof. The support plate has a second magnetic substance provided thereon and having an opposite polarity to a polarity of the first magnetic substance.

7 Claims, 7 Drawing Sheets

(56) References Cited

U.S. PATENT DOCUMENTS

| | | | | |
|---|---|---|---|---|
| 8,166,985 B2* | 5/2012 | Nishiyama | ........ | H01L 21/67046 134/137 |
| 2010/0163403 A1* | 7/2010 | Kitada | ........... | H01L 21/68742 204/164 |
| 2011/0164955 A1* | 7/2011 | White | ........... | H01L 21/68742 414/800 |
| 2011/0236162 A1* | 9/2011 | Shikayama | ....... | H01L 21/68742 414/222.01 |
| 2016/0020136 A1* | 1/2016 | Thallner | ........... | H01L 21/68721 294/65.5 |
| 2017/0278730 A1* | 9/2017 | Dou | ................. | H01L 21/67248 |

FOREIGN PATENT DOCUMENTS

| | | | |
|---|---|---|---|
| JP | 2001274225 A | * | 10/2001 |
| JP | 2007-277702 A | | 10/2007 |
| JP | 5561664 B2 | | 6/2014 |
| KR | 10-2005-0042965 A | | 5/2005 |
| KR | 1020070118452 A | | 12/2007 |
| KR | 10-0843107 B1 | | 7/2008 |
| KR | 100989852 B1 | * | 10/2010 |
| KR | 10-2014-0026175 A | | 3/2014 |
| KR | 20140026175 A | * | 3/2014 |
| KR | 20160032501 A | * | 3/2016 |
| KR | 1020160032500 A | | 3/2016 |
| KR | 1020160032501 A | | 3/2016 |
| KR | 1020170038157 A | | 4/2017 |

OTHER PUBLICATIONS

EP-2813716-A1 Espacenet Translation (Year: 2014).*
KR-20140026175-A EspaceNet Translation (Year: 2014).*
KR-20160032501-A EspqaceNet Translation (Year: 2016).*
BallBearing Wikipedia NPL (Year: 2015).*
KR-100989852-B1 EspaceNet Translation (Year: 2010).*

* cited by examiner

LIFT PIN UNIT AND SUBSTRATE SUPPORTING UNIT HAVING THE SAME

CROSS-REFERENCE TO RELATED APPLICATIONS

This application claims priority under 35 U.S.C. § 119 to Korean Patent Application No. 10-2017-0093924 filed on Jul. 25, 2017, in the Korean Intellectual Property Office, the disclosures of which are incorporated by reference herein in their entireties.

BACKGROUND

Embodiments of the inventive concept described herein relate to a lift pin unit seating a substrate on a substrate support and a substrate supporting unit including the same.

In general, to fabricate a semiconductor device, unit processes, such as depositing, coating, developing, etching, and washing, are sequentially or repeatedly performed with respect to a substrate. A substrate treatment apparatus performing the unit processes includes a plate for seating the substrate inside a chamber. A plurality of lift pins for supporting the substrate are arranged on the plate at regular spacing. Also, in order to fix the substrate, the plate fixes the substrate by using a clamp or a vacuum or utilizing an electrostatic force.

Referring to FIG. 1, a typical substrate treatment apparatus includes an electrostatic chuck (ESC) 1 to seat the substrate in a chamber (not illustrated). The ESC 1 seats the substrate on the top surface thereof, and includes a plurality of lift pins 2 are spaced apart from each other by predetermined spacing to separate the substrate from the top surface of the ESC 1 and to support the substrate. The ESC 1 has a plurality of pin holes 3 for mounting the lift pins 2. Each pin hole 3 is vertically formed through the ESC 1 such that the mounted lift pin 2 is vertically movable.

The lift pins 2 are engaged with a pin holder 4 under the ESC 1. To this end, the lift pin 2 and the pin holder 4 may be threaded with each other.

In this structure, when the pin holder is misaligned or the lift pins are misaligned during initial setting or during the use of the ESC 1 for a long time, the lift pins are lifted in contact with the inner side surface of the pin hole 3, thereby producing particles.

SUMMARY

Embodiments of the inventive concept provide a lift pin unit capable of precisely maintaining the alignment of a lift pin, and a substrate supporting unit including the same.

Embodiments of the inventive concept provide a lift pin unit capable of minimizing particles, and a substrate supporting unit including the same.

The objects to be achieved in the embodiments of the inventive concept are not limited to the above, but other objects, which are not mentioned, will be apparently understood to those skilled in the art.

According to an exemplary embodiment, there may be provided a substrate supporting unit including: a susceptor supporting the substrate and having a pin hole vertically formed therein; a lift pin provided to move up and down along the pin hole; a support plate supporting the lift pin; and a driving unit vertically moving the support plate. The lift pin and the support plate may be coupled to each other through a joint unit, and the lift pin may move relatively to the support plate.

In addition, the joint unit may include a first joint provided on a lower end of the lift pin and a second joint provided on an upper portion of the support plate, and the first joint may be inclined at a specific angle about the second joint.

In addition, the first joint and the second joint may be provided to be in point contact with each other.

Further, the lift pin may have a first magnetic substance formed at a lower end thereof, and the support plate may have a second magnetic substance provided thereon and having an opposite polarity to a polarity of the first magnetic substance.

In addition, the first magnetic substance and the second magnetic substance may be provided in a spherical shape to be in point contact with each other.

Further, the first magnetic substance and the second magnetic substance may be coupled to each other through a ball-joint structure.

In addition, an inner wall of the pin hole may include a third magnetic substance, and the lift pin is provided on an outer circumferential surface thereof with a fourth magnetic substance having a polarity the same as a polarity of the third magnetic substance.

Further, the third magnetic substance may be provided in a form that a magnetic material is coated on the inner wall of the pin hole.

Further, the third magnetic substance may be provided in a shape of a bush inserted into the inner wall of the pin hole.

In addition, the lift pin may be formed of a flexible material.

According to an exemplary embodiment, there may be provided a lift pin unit including: lift pins having upper ends which are in contact with a substrate to support the substrate and having magnetic substances; a support member on which the lift pins are mounted; and a lifting member lifting the support member. The lift pin and the support member may include a joint unit providing a degree of freedom to the lift pin and the support member.

In addition, the joint unit may include: a first joint formed on a lower end of the lift pin; and a second joint formed on an upper portion of the support member and coupled to the first joint. The first joint and the second joint may include magnetic substances having mutually different polarities such that attractive force acts between the first joint and the second joint.

In addition, the first joint and the second joint may be provided in a spherical shape to be in point contact with each other.

Further, one of the first joint and the second joint is provided in a spherical shape, and a remaining one of the first joint and the second joint has a shape of a socket having an insertion groove to surround the spherical shape.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

The terminology employed in the present specification and accompanying drawings are provided for the convenience of explanation, but the inventive concept is not limited thereto.

In addition, in the following description of an embodiment of the inventive concept, a detailed description of well-known features or functions will be ruled out in order not to unnecessarily obscure the gist of the inventive concept.

The embodiments set forth in the following description are provided to allow those skilled in the art to apparent understand the inventive concept and thus the inventive concept is not limited to the embodiments set forth in the following description. The modifications and the variations of the inventive concept are possible within the scope of the inventive concept.

Hereinafter, a substrate treatment apparatus 10 will be described according to one embodiment of the inventive concept.

Figure 1:
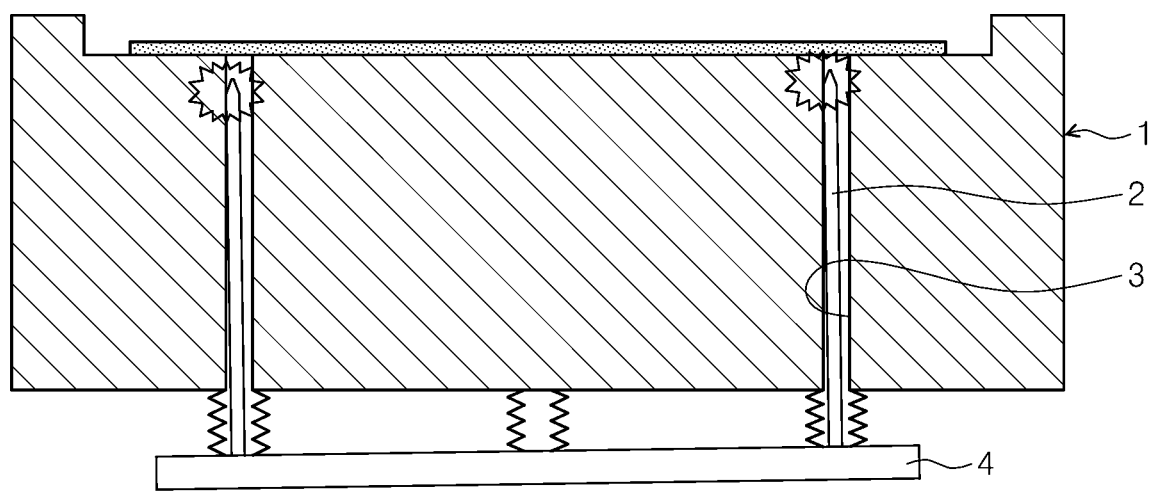
FIG. 1 is a view illustrating a typical lift pin unit.
Figure 2:
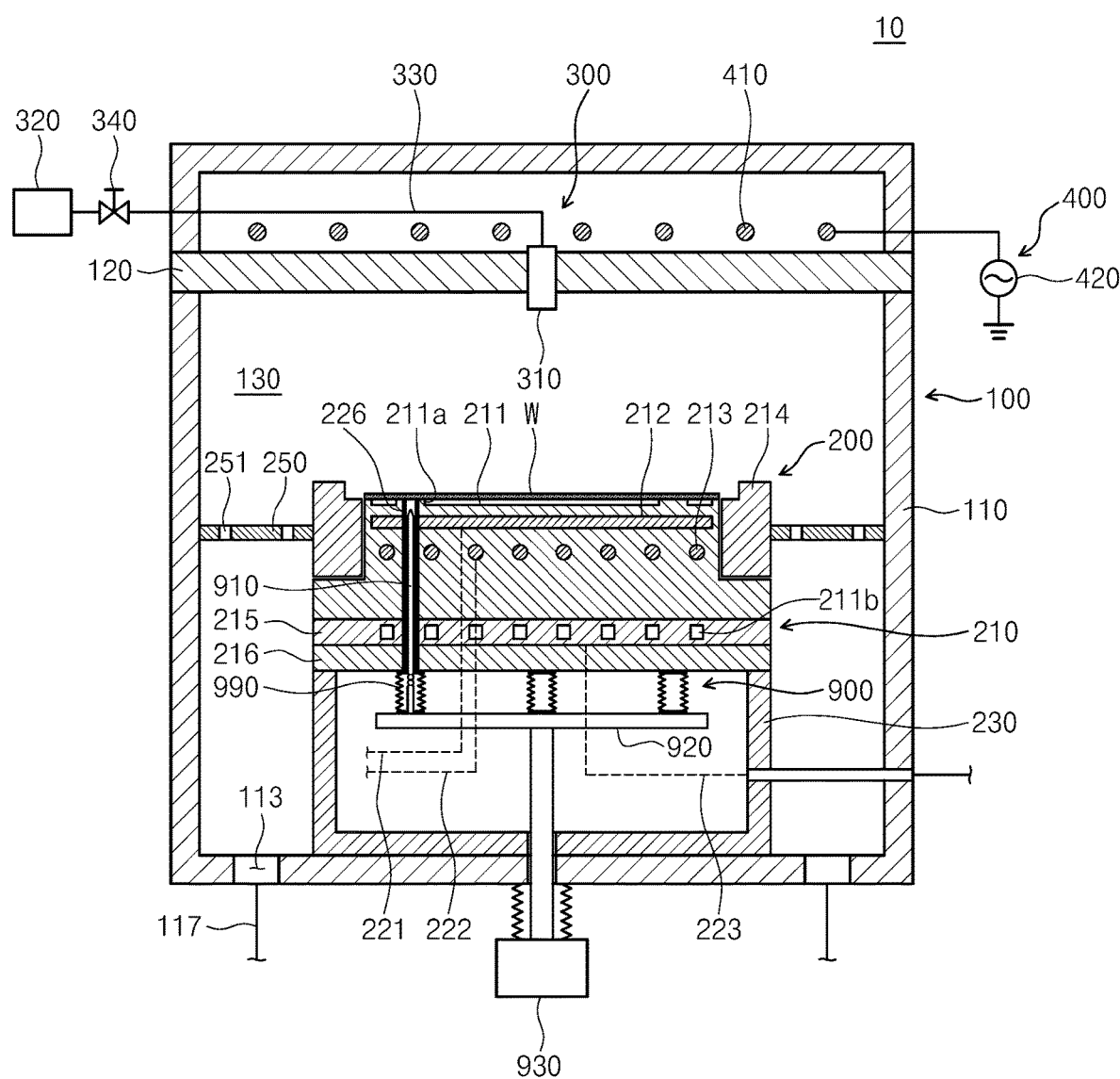
FIG. 2 is a sectional view illustrating a substrate treatment apparatus, according to an embodiment of the inventive concept.

FIG. 2 is a sectional view illustrating a substrate treatment apparatus, according to an embodiment of the inventive concept.

Referring to FIG. 2, the substrate treatment apparatus 10 may include a chamber 100, a substrate supporting unit 200, a gas supply unit 300, and a plasma source unit 400.

The chamber 100 provides a space in which plasma treatment is performed, and the substrate supporting unit 200 supports a substrate W inside the chamber 100. The gas supply unit 300 supplies process gas into the chamber 100 and the plasma source unit 400 provides electromagnetic waves into the chamber 100 to generate plasma from the process gas. Hereinafter, each configuration will be described in detail.

The chamber 100 includes a chamber body 110 and a dielectric cover 120. The chamber body 110 has an open top surface and an internal space. An exhaust hole 113 is formed in the floor of the chamber body 110. The exhaust hole 113 communicates with an exhaust line 117 to provide a passage for discharging gas remaining inside the chamber body 110 and reaction by-products, which are produced during a process procedure, to the outside. A plurality of exhaust holes 113 may be formed in edges of the floor of the chamber body 110.

The dielectric cover 120 seals the open top surface of the chamber body 110. The dielectric cover 120 has a radius corresponding to the circumference of the chamber body 110. The dielectric cover 120 may be formed of a dielectric material. The dielectric cover 120 may be formed of an aluminum material. The space surrounded by the dielectric cover 120 and the chamber body 110 serves as a treatment space 130 in which the plasma treatment process is performed.

A baffle 250 controls the flow of process gas inside the chamber 100. The baffle 250 is provided in a ring shape and interposed between the chamber 100 and the substrate supporting unit 200. Distribution holes 251 are formed in the baffle 250. The process gas staying in the chamber 100 is introduced into the exhaust holes 113 through the distribution holes 251. The flow of the process gas introduced into the exhaust holes 113 may be controlled depending on the shape and the arrangement of the distribution holes 251.

The gas supply unit 300 supplies the process gas into the chamber 100. The gas supply unit 300 includes a nozzle 310, a gas storage 320, and a gas supply line 330.

The nozzle 310 is mounted on the dielectric cover 120. The nozzle 310 may be positioned at the center of the dielectric cover 120. The nozzle 310 is linked to the gas storage 320 through the gas supply line 330. A valve 340 is mounted on the gas supply line 330. The valve 340 opens/closes the gas supply line 330 and adjusts the supply flow rate of the process gas. The process gas stored in the gas storage 320 is supplied to the nozzle 310 through the gas supply line 330 and is sprayed into the chamber 100 from the nozzle 310. The nozzle 310 mainly supplies the process gas to the central region of the treatment space 130. Alternatively, the gas supply unit 300 may further include a nozzle (not shown) mounted on a sidewall of the chamber body 110. The nozzle supplies the process gas to an edge region of the treatment space 130.

The plasma source unit 400 produces plasma from the process gas. The plasma source unit 400 includes an antenna 410, a power supply 420.

The antenna 410 is provided above the chamber 100. The antenna 410 may be provided in the form of a spiral coil. The power supply 420 is connected with the antenna 410 through a cable to apply high-frequency power to the antenna 410. As the high-frequency power is applied, an electromagnetic wave is generated from the antenna 410. The electromagnetic wave forms an induced electric field inside the chamber 100. The process gas is changed to plasma by obtaining the energy required for ionization from the induced electric field. The plasma may be applied to the substrate W and an etching process may be performed.

The substrate supporting unit 200 is positioned in the treatment space 130 to support the substrate W. The substrate supporting unit 200 may fix the substrate W using electrostatic force or may support the substrate W in a mechanical clamping manner. Hereinafter, a manner that the substrate supporting unit 200 fixes the substrate W by using the electrostatic force will be described by way of example.

Figure 3:
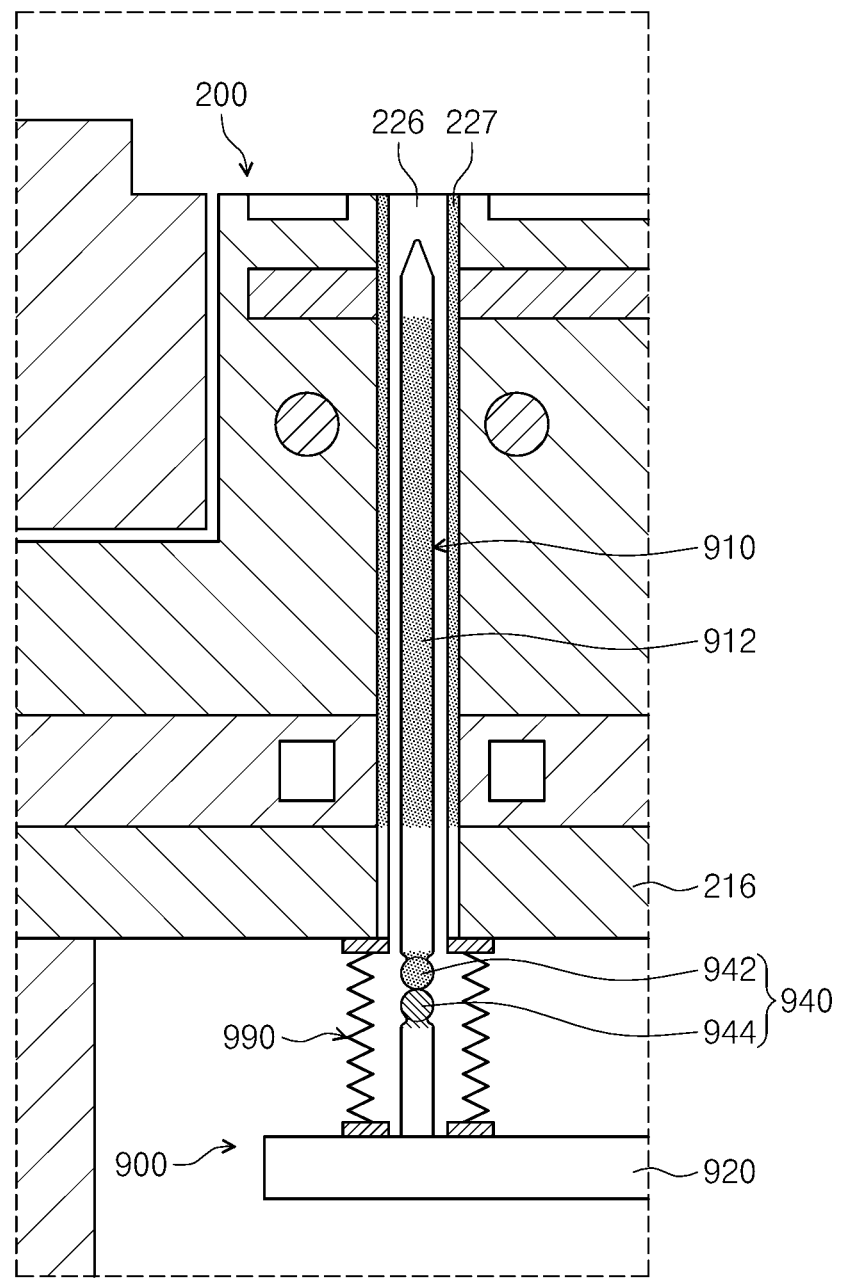
FIG. 3 is an enlarged sectional view illustrating main components of the lift pin unit in detail.

FIG. 3 is an enlarged sectional view illustrating main components of a lift pin unit.

Referring to FIGS. 2 and 3, the substrate supporting unit 200 includes a susceptor 210, a housing 230, and a lift pin unit 900.

The susceptor 210 adsorbs the substrate W by using electrostatic force. The susceptor 210 may include a dielectric plate 211, an electrode 212, a heater 213, a focus ring 214, an insulating plate 215, and a grounding plate 216.

The dielectric plate 211 is provided in a disc shape. The top surface of the dielectric plate 211 may have the radius equal to or smaller than that of the substrate W. Protrusion parts 211a may be formed on the top surface of the dielectric plate 211. The substrate W is placed on the protrusion parts 211a and is spaced apart from the dielectric plate 211 by a predetermined distance. The lateral side of the dielectric plate 211 may be stepped such that the dielectric plate 211 has a greater diameter in a lower region rather than an upper region thereof.

The electrode 212 is buried inside the dielectric plate 211. The electrode 212, which has the shape of a disc plate having a thinner thickness and formed of a conductive material, is connected with an external power source (not illustrated) through a cable 221. Power applied from the external power source generates electrostatic force between the electrode 212 and the substrate W to fix the substrate W on the top surface of the dielectric plate 211.

The heater 213 is provided inside the dielectric plate 211. The heater 213 may be provided under the electrode 212. The heater 213 is connected with the external power source (not illustrated) through a cable 222. The heater 213 emits heat by resisting against a current applied thereto from the external power source. The emitted heat is transferred to the substrate W through the dielectric plate 211 to heat the substrate W to a specific temperature. The heater 213 is provided in the form of a spiral coil. Heaters 213 may be buried inside the dielectric plate 211 at uniform spacing.

A focus ring 214 is provided in a ring shape and arranged along the circumference of an upper region of the dielectric plate 211. The top surface of the focus ring 214 may be stepped such that an inner portion of the top surface, which is adjacent to the dielectric plate 211, is lower than an outer portion of the top surface. The inner portion of the top surface of the focus ring 214 may be positioned at the height equal to that of the top surface of the dielectric plate 211. The focus ring 214 may expand a region for forming an electric field such that the substrate W is positioned at the center of the region for forming plasma. Accordingly, the plasma may be uniformly formed throughout the whole region of the substrate W.

The insulating plate 215 is positioned under the dielectric plate 211 to support the dielectric plate 211. The insulating plate 215, which is a disc plate having a predetermined thickness, may have the radius corresponding to that of the dielectric plate 211. The insulating plate 215 is formed of an insulating material. The insulating plate 215 is connected with the external power source (not illustrated) through a cable 223. The high-frequency current applied to the insulating plate 215 through the cable 223 forms an electromagnetic field between the substrate supporting unit 200 and the dielectric cover 120. The electromagnetic field is provided as energy to generate the plasma.

A cooling flow passage 211b is formed in the insulating plate 215. The cooling flow passage 211b is positioned under the heater 213. The cooling flow passage 211b may provide a passage which the cooling fluid circulates. The heat of the cooling fluid is transferred to the dielectric plate 211 and the substrate W, and the dielectric plate 211 and the substrate W, which are heated, are rapidly cooled. The cooling flow passage 211b may be formed in a spiral shape. Alternatively, cooling flow passages 211b having ring-shaped sections with mutually different radiuses may be arranged to have a common center. The cooling flow passages 211b may communicate with each other. Alternatively, the cooling flow passages 211b may be formed in a grounding plate 216.

The grounding plate 216 is positioned under the insulating plate 215. The grounding plate 216, which is a disc plate having a predetermined thickness, may have the radius corresponding to that of the insulating plate 215. The grounding plate 216 is grounded. The grounding plate 216 electrically insulates the insulating plate 215 from the chamber body 110.

A pin hole 226 is formed inside the susceptor 210. The pin hole 226 is formed in a top surface of the susceptor 210. The pin hole 226 may be vertically formed through the susceptor 210. The pin hole 226 is provided from the top surface of the dielectric plate 211 toward the bottom surface of the grounding plate 216 by sequentially passing through the dielectric plate 211, the insulating plate 215, and the grounding plate 216.

A plurality of pin holes 226 may be formed. The pin holes 226 may be arranged in the circumferential direction of the dielectric plate 211. For example, three pin holes 226 may be arranged in the circumferential direction of the dielectric plate 211 while being spaced apart from each other at 120 degrees. In addition, four pin holes 226 may be arranged in the circumferential direction of the dielectric plate 211 while being spaced apart from each other at 90 degrees. In other words, various numbers of pin holes 226 may be formed.

Further, the pin hole 226 may be formed in the protrusion part 211a of the dielectric plate 211. For example, the pin hole 226 having a circular shape may be formed at the center of the protrusion part 211a having a circular planar shape. However, the protrusion part 211a and the pin hole 226 may be variously provided when viewed from the plane view.

The pin hole 226 may be formed in a portion of the protrusion part 211a. For example, six protrusion parts 211a may be arranged in the circumferential direction of the dielectric plate 211 while being spaced apart from each other at 60 degrees, and three pin holes 226 may be arranged while being spaced apart from each other at 30 degrees.

The housing 230 is positioned under the grounding plate 216 to support the grounding plate 216. The housing 230 has the shape of a cylinder having a specific height and has an internal space. The housing 230 may have a modification corresponding to the grounding plate 216. Various cables 221, 222, and 223 and a lift pin unit 900 are positioned inside the housing 230.

As the lift pin unit 900 moves up and down, the lift pin unit 900 loads the substrate W onto the dielectric plate 211 or unloads the substrate W from the dielectric plate 211.

For example, the lift pin unit 900 may include a lift pin 910, a support plate 920, and a driving unit 930.

A plurality of lift pins 910 are provided and received in the pin holes 226. In this case, the diameter of the lift pin 910 may be slightly less than that of the pin hole 226. In detail, the lift pin 910 may have the diameter to prevent the lift pin 910 from being in contact with the inner sidewall of the pin hole 226 when the lift pin 910 and the pin hole 226 are arranged to have a common central axis.

Figure 6:
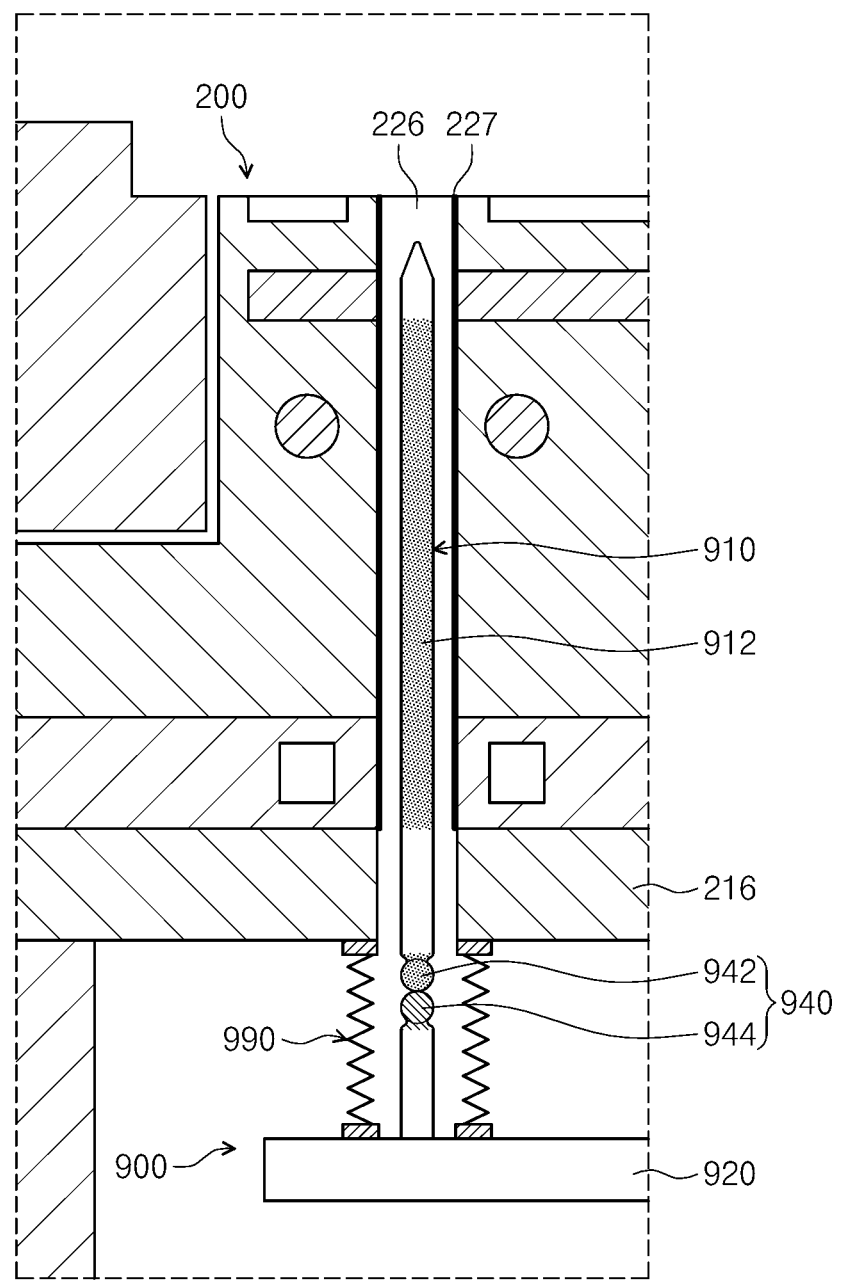
FIG. 6 is a view illustrating another example of a third magnetic substrate of a pin hole.

Meanwhile, the lift pin 910 includes a fourth magnetic substance 912 and a third magnetic substance 227 is provided on the inner wall of the pin hole 226. The fourth magnetic substance 912 may include a magnetic substance which is coated onto an outer circumferential surface of the lift pin 910 or inserted into the lift pin 910. The fourth magnetic substance 912 may be coated onto a partial section of the lift pin 910 except for an upper end of the lift pin 910 supporting the substrate W. The third magnetic substance 227 may be provided in the shape of a bush inserted into the pin hole 226. However, the third magnetic substance 227 may be provided in the form that a substance having a magnetic property is coated onto the inner wall of the pin hole 226 as illustrated in FIG. 6.

The fourth magnetic substance 912 and the third magnetic substance 227 may have the same magnetic polarity. In other words, when the lift pin 910 moves up and down in the pin hole 226, repulsive force is generated between the fourth magnetic substance 912 of the lift pin 910 and the third magnetic substance 227 of the pin hole 226 such that the fourth magnetic substance 912 and the third magnetic substance 227 push each other. Accordingly, the lift pin 910 is aligned on the central axis of the pin hole 226 without being in contact with the inner wall of the pin hole 226.

The lift pins 910 move up and down along the pin holes 226 to load/unload the substrate W. For example, the lift pin 910 moves up to support the substrate W, which is transferred onto the susceptor 210 by a transfer arm (not illustrated), and then moves down to load the substrate W onto the susceptor 210. For another example, the lift pin 910 unloads the substrate W by moving up while supporting the substrate W placed on the susceptor 210 and then moves down again if the substrate W is transferred by the transfer arm.

The support plate 920 or a support member is positioned inside the housing 230 to support the lift pins 910. The support plate 920 may be coupled to a driving unit 930 or a lifting member.

The support plate 920 and the lift pin 910 may be coupled to each other by a joint unit 940. The joint unit 940 may be provided such that the lift pin 910 moves (or has the degree of freedom) relatively to the support plate 920. For example, the joint unit 940 may include a first joint 942 formed on a lower end of the lift pin 910 and a second joint 944 which is formed on an upper portion of the support plate 920 and linked to the first joint 942. The first joint 942 may be inclined at a predetermined angle about the second joint 944.

The joint unit 940 may be interposed between the susceptor 210 and the support plate 920. Alternatively, the joint unit 940 may be positioned inside the pin hole 226. The position of the joint unit 940 may be determined depending on the length of the lift pin 910, the size of the maximum allowance angle of the lift pin 910, and the spacing between the lift pin 910 and the pin hole 226.

The first joint 942 and the second joint 944 may include magnetic substances having mutually different polarities to generate attractive force. For example, the first joint 942 of the lift pin 910 may include a first magnetic substance, and the second joint 944 of the support plate 920 may include a second magnetic substance having an opposite polarity to that of the first magnetic substance.

The contact part between the first joint 942 and the second joint 944 may have the shape to minimize the frictional force. For example, each of the first joint 942 and the second joint 944 may be provided in the shape of a sphere such that the first joint 942 is in point contact with the second joint 944.

In addition, the lift pin 910 may be provided to be bended to a specific extent. To this end, the lift pin 910 may be formed of a flexible material. Even when the first joint 942 is inclined about the second joint 944, the lift pin 910 is prevented from being bended to be in contact with the pin hole 226 by the repulsive force between the third magnetic substance 227 and the fourth magnetic substance 912.

The lift pin 910 may be extended or shrunken to a specific extent due to the flexibility. When the lift pin 910 becomes in contact with the substrate, the lift pin 910 is contracted to minimize the impact applied to the substrate. Therefore, particles produced between the contact between the lift pin 910 and the substrate may be minimized.

The driving unit 930 or the lifting member lifts the support plate 920. As the driving unit 930 is driven, the support plate 920 moves up or down while the lift pins 910 moving along the pin holes 226. The driving unit 930 may be positioned outside the chamber 100. The driving unit 930 may include a hydraulic or pneumatic cylinder, but the inventive concept is not limited. Although FIG. 2 illustrates one driving unit 930, the driving unit 930 may include a plurality of driving units to lift the lift pins 910, respectively.

A bellows 990 may be interposed between the grounding plate 216 and the support plate 920. An upper end portion of the bellows 990 may be coupled to the grounding plate 216, and a lower end portion of the bellows 990 may be coupled to the support plate 920. The bellows 990 may be provided to surround the lift pin 910 positioned inside the housing 230. The bellows 990 may be shrunken and extended in a vertical direction as the support plate 920 moves up and down.

Figure 4:
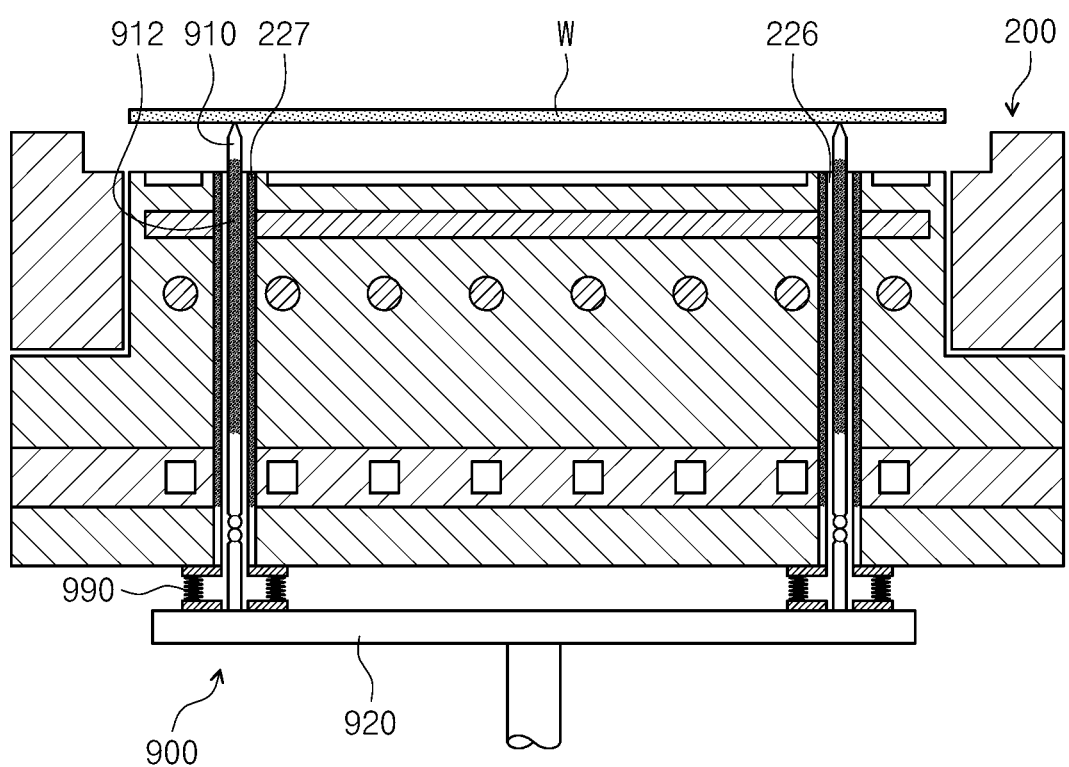
FIG. 4 is a view illustrating a substrate supported by the lift pin unit.

FIG. 4 is a view illustrating that the substrate supporting unit supports the substrate.

As illustrated in FIG. 4, as the lift pin 910 moves up, the lift pin 910 supports the substrate which is transferred onto the susceptor 210 by the transfer arm (not illustrated). In addition, when the lift pin 910 moves down, the substrate is placed on the top surface of the dielectric plate 211.

The lift pin 910 may move up to protrude higher than the protrusion part 211a. In addition, the lift pin 910 may move down to regress lower than the protrusion part 211a or to be provided at the same height as that of the protrusion part 211a.

Figure 5:
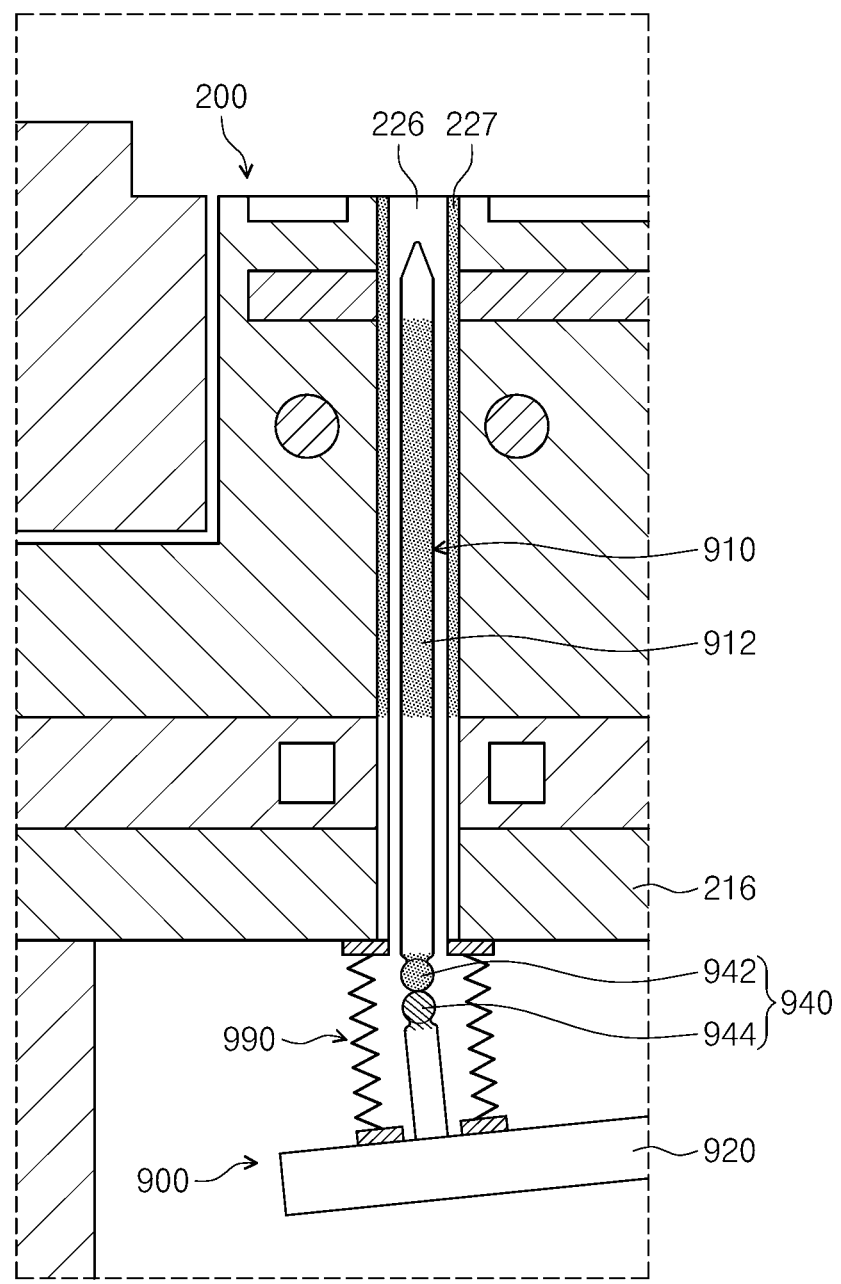
FIG. 5 is a view illustrating the case that the support plate of the substrate supporting unit is twisted.

FIG. 5 is a view illustrating the case that the support plate of the substrate supporting unit is twisted.

As illustrated in FIG. 5, even if the support plate 920 is offset at a specific angle, the alignment of the lift pin 910 in the pin hole 226 may be exactly maintained. In other words, the lift pin 910 may be maintained to be aligned on the central axis of the pin hole 226 without being in contact with the inner wall of the pin hole 226, by the repulsive force allowing the fourth magnetic substance 912 and the third magnetic substance 227 to push each other. If the lift pin 910 and the support plate 920 are coupled to each other through a bolt without the degree of freedom, as the alignment of the support plate 920 is offset, even the alignment of the lift pin 910 may be offset. According to the inventive concept, the lift pin 910 is coupled to the support plate 920 through a joint structure having the degree of freedom. Therefore, even if the alignment of the support plate 920 is offset, the alignment of the lift pin 910 may be maintained in the pin hole 226.

Figure 7:
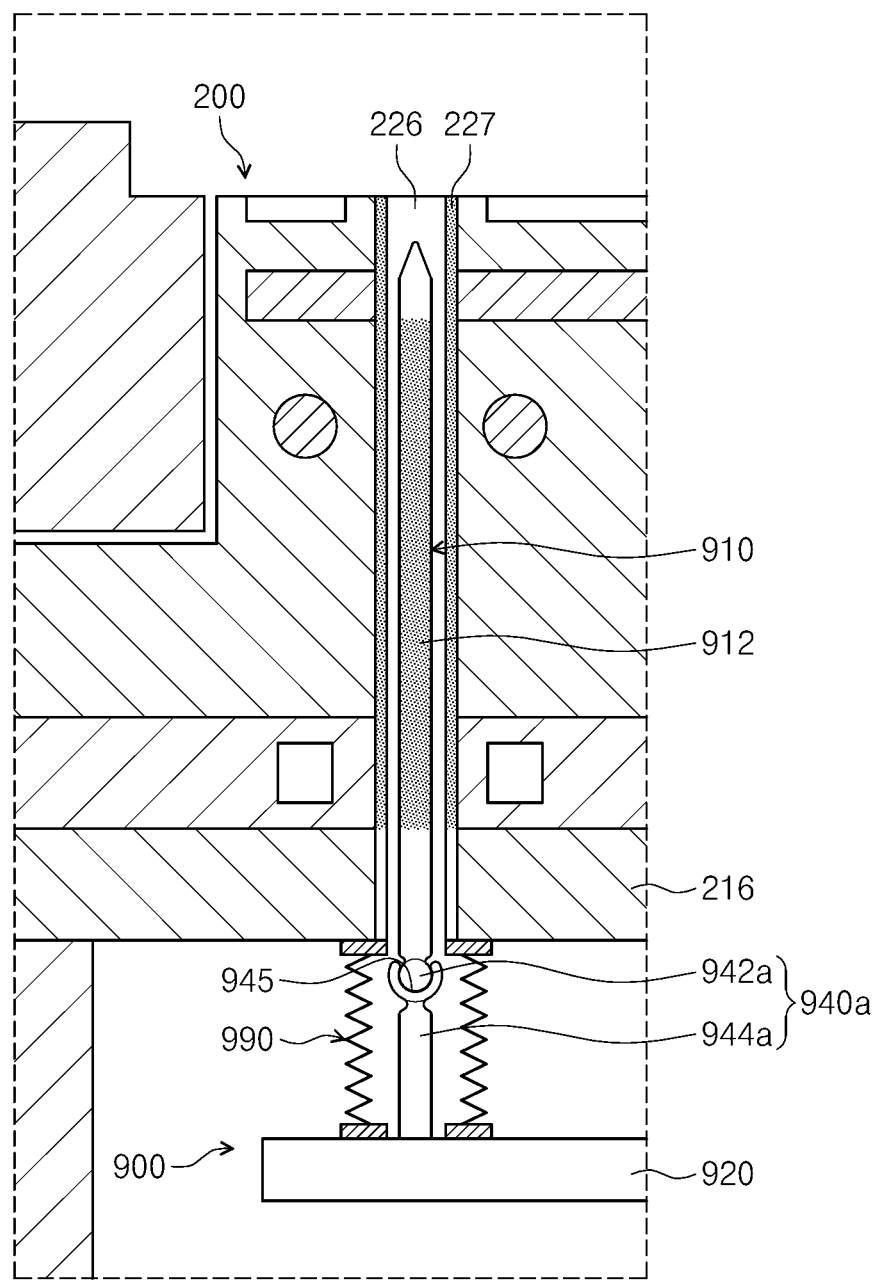
FIG. 7 is a view illustrating another example of a joint unit to join the support plate with the lift pin.

FIG. 7 is a view illustrating another example of a joint unit to couple the support plate to the lift pin.

As illustrated in FIG. 7, according to another example, a joint unit 940a includes a first joint 942a having a spherical shape and a second joint 944a having a socket shape. The first joint 942a is formed on a lower end of the lift pin 910 and the second joint 944a is formed on an upper portion of the support plate 920. The second joint 944a has an insertion groove 945 to surround the first joint 942a having the spherical shape.

Since the joint unit 940a has a ball-joint structure as described above, even if the first joint 942a and the second joint 944a are not realized with magnetic substances, the joint unit 940a may produce the same effect.

In contrast to the structure illustrated in the drawing, the joint unit 940a may include a first joint having a socket shape and a second joint having a spherical shape. The first joint may have an insertion groove to surround the second joint having the spherical shape.

In the embodiment described in the present specification, the above components or the steps are not essential, so the inventive concept may selectively include the components or the steps. In addition, since the steps do not need to perform in the above-described order, the step described later may be performed prior to the step earlier described.

Further, the above embodiments do not need to be independently performed, and the embodiments may be used individually or in the combination form.

According to the inventive concept, the lift pin is coupled to the support plate through the joint structure having the degree of freedom. Accordingly, even if the support plate is misaligned, the alignment of the lift pin is maintained in the pin hole, thereby producing a special effect.

According to the inventive concept, the lift pin is precisely aligned in the pin hole, thereby preventing an inner surface of the pin hole from being scratched due to the contact between the pin and the pin hole.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A substrate supporting unit which supports a substrate, the substrate supporting unit comprising:
   a susceptor being configured for supporting the substrate and having a pin hole vertically formed therein;
   a lift pin provided to move up and down along the pin hole;
   a support plate being configured for supporting the lift pin; and
   a driving unit vertically moving the support plate,
   wherein the lift pin and the support plate are coupled to each other through a joint unit;
   wherein the lift pin moves relatively to the support plate;
   wherein the joint unit includes a first joint provided on a lower end of the lift pin and a second joint provided on an upper portion of the support plate, and the first joint is inclined at a specific angle about the second joint;
   wherein the lift pin has a first magnetic substance formed at a lower end thereof;
   wherein the support plate has a second magnetic substance provided thereon and having an opposite polarity to a polarity of the first magnetic substance;
   wherein the first magnetic substance and the second magnetic substance are provided in a spherical shape to be in point contact with each other.

2. The substrate supporting unit of claim 1, wherein the first joint and the second joint are provided to be in point contact with each other.

3. The substrate supporting unit of claim 1, wherein the first magnetic substance and the second magnetic substance are coupled to each other through a ball-joint structure.

4. The substrate supporting unit of claim 1, wherein the lift pin is formed of a flexible material to be bendable.

5. The substrate supporting unit of claim 1, wherein the lift pin is provided on an outer circumferential surface thereof with a fourth magnetic substance having a polarity the same as a polarity of a third magnetic substance provided on an inner wall of the pin hole.

6. The substrate supporting unit of claim 5, wherein the third magnetic substance is provided in a form that a magnetic material is coated on the inner wall of the pin hole.

7. The substrate supporting unit of claim 5, wherein the third magnetic substance is inserted into the inner wall of the pin hole.

* * * * *